(12) United States Patent
Kappler

(10) Patent No.: US 7,531,069 B2
(45) Date of Patent: May 12, 2009

(54) DEVICE FOR THE TRANSPORT OF FLEXIBLE PLANAR MATERIAL, IN PARTICULAR CIRCUIT BOARDS

(75) Inventor: Heinz Kappler, Dornstetten-Aach (DE)

(73) Assignee: Gebr. Schmid GmbH & Co., Freudenstadt (DE)

( * ) Notice: Subject to any disclaimer, the term of this patent is extended or adjusted under 35 U.S.C. 154(b) by 896 days.

(21) Appl. No.: 10/494,774

(22) PCT Filed: Oct. 26, 2002

(86) PCT No.: PCT/EP02/11990

§ 371 (c)(1), (2), (4) Date: Nov. 12, 2004

(87) PCT Pub. No.: WO03/041475

PCT Pub. Date: May 15, 2003

(65) Prior Publication Data

US 2005/0073084 A1    Apr. 7, 2005

(30) Foreign Application Priority Data

Nov. 5, 2001 (DE) ............................... 101 54 884

(51) Int. Cl.
*B65G 13/06* (2006.01)
*C25D 17/00* (2006.01)
(52) U.S. Cl. .................. 204/198; 204/202; 118/429
(58) Field of Classification Search ................ 204/198, 204/202; 118/429
See application file for complete search history.

(56) References Cited

U.S. PATENT DOCUMENTS 5,791,453 A    8/1998    Schmits et al.
5,833,816 A *  11/1998   Heermann et al. .......... 204/198
5,914,016 A    6/1999    Schmid

FOREIGN PATENT DOCUMENTS

| DE | 43 39 092  | 5/1995 |
| DE | 43 39 263  | 5/1995 |
| DE | 195 09 313 | 9/1996 |
| DE | 195 24 562 | 1/1997 |
| DE | 197 48 337 | 5/1999 |

(Continued)

OTHER PUBLICATIONS

Office Action of Japanese Patent Office dated Aug. 7, 2007 (2 pages).

*Primary Examiner*—Arun S Phasge
(74) *Attorney, Agent, or Firm*—Flynn, Thiel, Boutell & Tanis, P.C.

(57) ABSTRACT

A transport system for circuit boards (12) in treatment devices (11) which runs the circuit boards (12) between pairs of rollers (20, 21). The pairs of rollers are arranged in roller tracks (17, 18) running parallel to the edge of the circuit board (12) in a narrowly defined boundary region (16). The rollers are arranged with the axes (22) and shafts (23) thereof arranged at an angle ($\alpha$) relative to the transport direction (14) or the perpendicular (35) thereof, such as to exert a tensile force on the circuit boards in the transverse direction thereof and thus stiffening the same. Transport through treatment, for example galvanization, etching, cleaning etc., without contact with the useful region (15) of the circuit board (12) is thus possible.

13 Claims, 3 Drawing Sheets

FOREIGN PATENT DOCUMENTS

| | | |
|---|---|---|
| JP | 61-012556 | 1/1986 |
| JP | 62-280109 | 12/1987 |
| JP | 07237746 A | 9/1995 |
| JP | 07-330129 | 12/1995 |
| JP | 11-035119 | 2/1999 |

* cited by examiner

DEVICE FOR THE TRANSPORT OF FLEXIBLE PLANAR MATERIAL, IN PARTICULAR CIRCUIT BOARDS

FIELD OF APPLICATION AND STATE OF THE ART

The invention relates to a device for the transport of flexible plate-like or sheet-like planar material, in particular circuit boards, into treatment devices, whereby the planar material is gripped in the boundary regions.

Circuit boards for electrical circuits, for the arrangement of electronic components, etc. consist usually of an electrically insulating substrate, on which strip conductors are mounted by optical, chemical or electrochemical methods. This occurs in treatment devices, in which the circuit boards are treated mostly by liquid treatment means such as developing by photoresist, etching, rubbing, etc. The substrates are very thin and have in parts only a thickness of 25 µm with a coating of 5 µm. They are therefore, since they consist of a flexible material, almost only sheet-like or foil-like.

These planar materials are transported into the treatment devices in various ways depending on the type of treatment, such as between pairs or rollers (DE 196 28 784 A), whereby they are contacted, for example in a galvanic device, in the boundary region by electrical contact rollers.

Also devices are already known, which are designed like wobble plates, in order to prevent the strip-like masking, which is damaging for many treatments, by the pairs of rollers (compare DE 197 48 337 A).

It has also already become known (DE 195 09 313) to transport circuit boards, which are treated only on one side, by vacuum-loaded bands in a "suspended manner".

It has furthermore become known from DE 43 39 263 A1 to guide circuit boards through treatment devices by their boundary regions (or outer rim areas) being guided on suction bands, which are guided in diverging directions. It is indeed possible with this to guide the center area of the circuit board essentially without any contact. However, the boundary region needed by the bands is very wide, which is in most cases not accepted. Furthermore it is possible in the case of the wet treatment, in particular with aggressive chemicals, for the liquid to be pulled into the suction device to create problems.

PURPOSE AND SOLUTION

The purpose of the invention is to produce a device, with which the planar material can be transported without contact and without any significant limitation of the useful region through the treatment device.

This purpose is attained by the characteristics of the present invention. The pairs of rollers, which are pressed onto one another or onto the planar material, are arranged in roller tracks; which run on an outer edge of the planar materials, whose outer edge extends parallel to the transporting direction, and thus hardly interfere with the usable center area. Indeed this area is stressed more by the outwardly acting tensile load, also leads to a certain outwardly directed relative movement between the contact surfaces of the rollers and the surface of the planar material, however, these surfaces are anyhow insignificant for the circuit boards. In spite of the at all times outwardly directed running direction of the rollers, namely a transport component directed in a transverse direction to the transporting direction, the roller track is limited to a narrow parallel strip. Thus each of the rollers produces a tensile force outwardly, which moves along the planar material boundary.

The angle at which the rollers are pitched relative to the transporting direction can be extremely small and lies in the range of fractions of degrees to a few degrees, in particular at 0.5°.

Thus, the invention makes it possible to guide planar materials, in particular, circuit boards, without contact through the treatment systems. It is thereby not to be feared that the sensitive surfaces, for example a moist photoresist, are damaged by the rollers, which run on the surface to be treated, as this is mostly the case in the state of the art. Also, it is not possible to "roll on" dirt particles by the rollers.

In the case of slightly stiffer planar materials, it is also possible to apply a certain compressive strain so that, for example, an upwardly directed arching or bowing occurs. The contact surfaces can, for this purpose, grip and guide the planar material at an angle relative to the plane of the planar material so that the edges are directed slightly upwardly. This design permits a particularly good drainage of liquids so that no "puddles" can form on the surface, which could interfere with the uniformity of the treatment.

It is pointed out in this connection that a "bowed transport" is described in the DE 195 24 562, however, with different characteristics and means.

One embodiment according to the invention also makes it possible to adjust the transport system to varying widths of planar materials. A space adjusting device is provided for this purpose, which adjusts the distance between the roller tracks. These are preferably synchronously driven and can also be adjusted synchronously oppositely directed to one another. Details of this are described in the subclaims.

The invention thus creates with a preferred embodiment a transport system for circuit boards which guides the circuit boards between pairs of rollers. The pairs of rollers are arranged in roller tracks, which run parallel to the edge of the circuit board in a narrowly defined boundary region. The rollers are arranged with their axes and shafts at an angle relative to the transporting direction or the vertical thereof so that they apply a tensile force, which acts in a transverse direction, onto the circuit boards and thus stiffens the circuit board. Thus, transport without contact in the useful region through the treatment devices, such as galvanization, etching, cleaning, etc. is possible.

The above and further characteristics can be taken from the claims and also the description and the drawings, whereby the individual characteristics can be realized by themselves or several together in the form of sub-combinations in an embodiment of the invention and in other fields and can represent advantageous and, by themselves, protectable embodiments, for which protection is here claimed. The division of the application into individual sections and inbetween titles does not limit the disclosure given under said titles in their general validity.

BRIEF DESCRIPTION OF THE DRAWINGS

One exemplary embodiment of the invention is illustrated in the drawings and will be discussed in greater detail hereinafter. In the Drawings.

DESCRIPTION OF THE EXEMPLARY EMBODIMENTS

Figure 1:
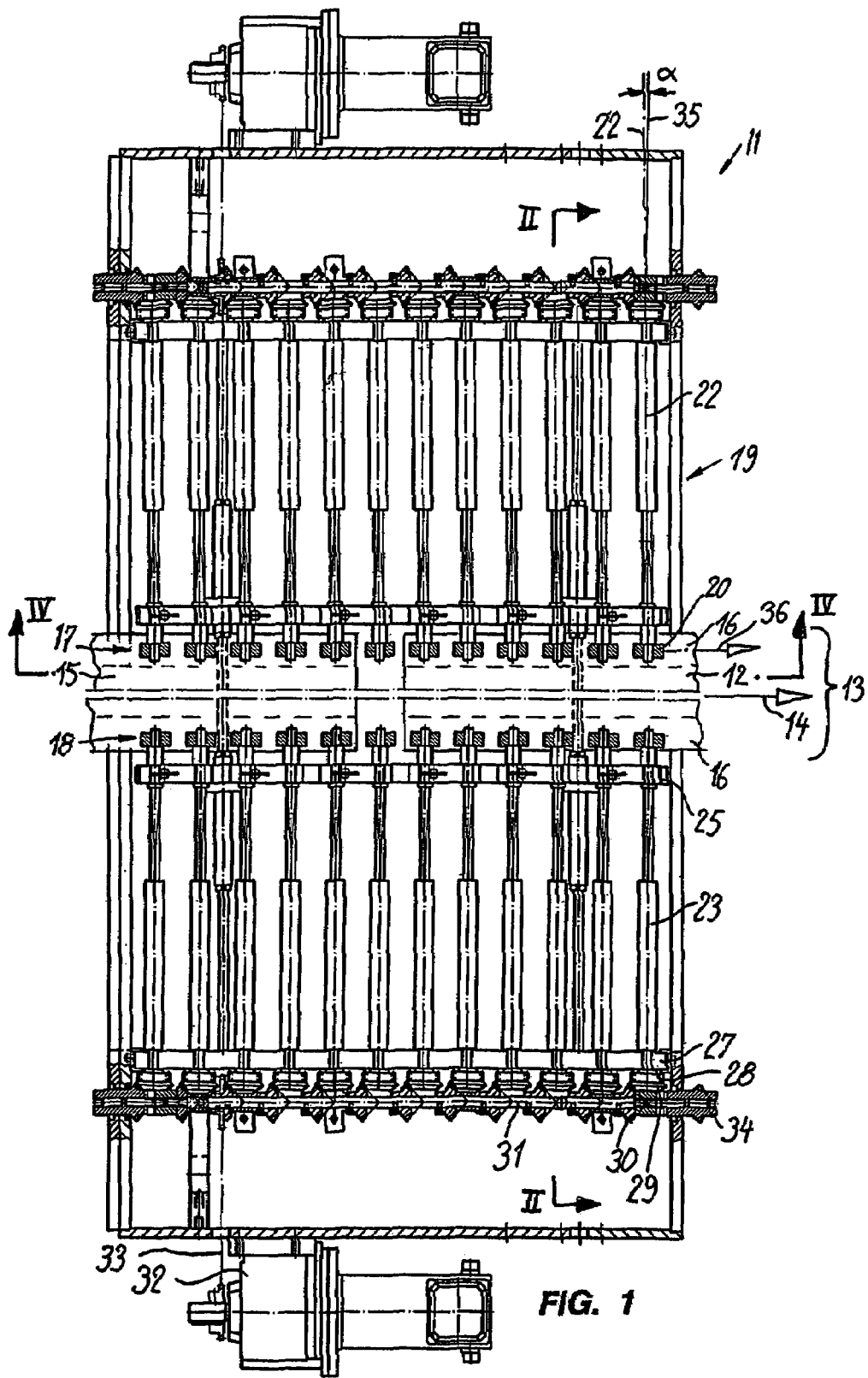
FIG. 1 is a top view of a treatment device with the transport device according to the invention.

FIG. 1 illustrates a treatment device 11 for circuit boards 12. The treatment device 11 consists essentially of a trough, in the treatment area 13 of which a treatment medium, for example a liquid, acts onto the circuit boards. In addition spray nozzles, suction systems, or the like, which are not illustrated, can be provided.

The circuit boards, which are essentially sheet-shaped and consist of a flat material, such as fiber-reinforced plastics or the like, are guided horizontally in a transporting direction 14 through the treatment device, whereby they are usually guided through an inlet and outlet lock. The illustrated treatment device is very short in transporting direction. Many of these devices are, however, significantly longer.

The thin, flexible circuit boards 12 have a useful region 15, onto which strip conductors are mounted, and boundary regions 16, which extend at both edges parallel to the transporting direction, and which are usually free of strip conductors or other operating elements. Roller conveyors 17, 18 engage the circuit board in these boundary regions, which are part of the transporting means 19, which have the purpose to transport the strip conductors in the transporting direction 14 through the treatment device 11.

The roller conveyors 17, 18 consist of pairs of rollers (compare also FIGS. 2 to 4) with upper rollers 20 and lower rollers 21, which mostly consist of a flexible plastic material, which is resistant to the chemicals being used, and with the contact surfaces of which engage the circuit boards 12 with a good frictional engagement. The rollers are each arranged at a relative short distance from one another (i.e. one behind the other) in the transporting direction 14 so that their axes 22 are spaced between 1.2 and 2 times of the roller diameter from one another.

Figure 2:
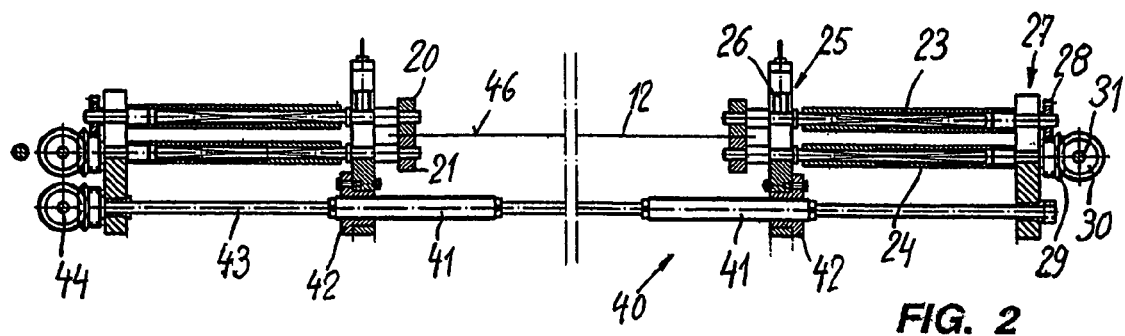
FIG. 2 is a cross-sectional view along the line II-II of FIG. 1.
Figure 3:
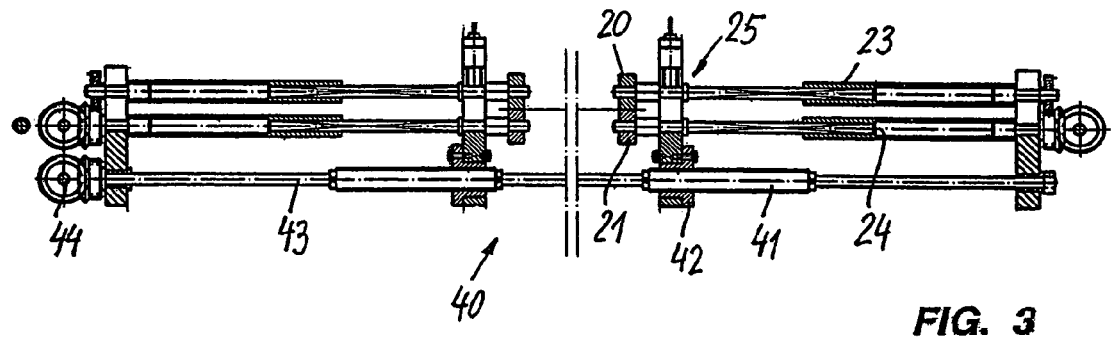
FIG. 3 is a cross-sectional view according to FIG. 2 in a different width adjustment of the transport system.

Each roller is carried by a shaft 23, which has two parts and can be changed in length by means of a sliding fit. FIGS. 1 to 3 illustrate that the rollers 20, 21 are each arranged on two shafts 23, 24 on their freely projecting shaft ends, the shafts located one above the other and extending parallel to one another. The shafts 23, 24 are supported in a support traverse 25, whereby the upper shaft 23 is vertically movable with the roller 20, that is, against the force of a pressure spring 26, which provides for a contact pressure between the contact surfaces of the rollers 20, 21 and the two flat sides of the circuit board 12 in the boundary region 16.

The ends of the telescopic shafts 23, 24 opposite the rollers are also supported in a support traverse 27 and have synchronization gears 28 on their shaft ends which freely project from the support traverse 27. The synchronization gears 28 guarantee an oppositely directed synchronous drive of the axial shafts and thus of the rollers. In addition, a bevel gear 29 sits on the lower shaft 24 and cooperates with a drive bevel gear 30, which is arranged on a synchronous drive shaft 31. Each pair of shafts 23, 24, and thus each pair of rollers 20, 21, has such a drive so that all rollers are driven at the same speed. The synchronous shafts 31 on both sides of the treatment device 11 can be driven by a common drive 32, for example, through a chain or a toothed belt 33.

FIG. 1 illustrates a system with a total of twelve sets of rollers on each side. In the case of longer treatment devices it is possible to arrange several of such systems or transport modules one behind the other, whereby the synchronous shafts can be connected to one another through couplings 34.

The axes 22 of the shafts 23, 24, and thus of the rollers 20, 21, are inclined at an angle α, which is approximately 0.5° in a preferred embodiment, however, depending on the conditions, can be between 0.1° and 2°, relative to a vertical 35 with respect to the transporting direction 14, namely so that the rolling direction 36 of the rollers 20, 21 converges outwardly in the transporting direction from said rolling direction.

This track angle α is achieved through a suitable shift of the shaft bearings in the support traverses 25 and 27 in a horizontal direction to one another. It can be adjusted by moving the traverses, for example, in the transporting direction against one another, in particular, when the shafts or their bearings are received pivotally therein, for example with play (or backlash), elastically in ball bearings or the like.

Since the pairs of rollers 20, 21 are always supposed to run in the boundary region 16 of the circuit boards 12, their distance from one another can be adjusted in the horizontal direction transversely with respect to the transporting direction 14. This can be seen from FIGS. 2 and 3. FIG. 2 shows an adjustment, which corresponds to the largest circuit board width to be transported. An adjusting device 40 is provided for the adjustment, which adjusting device operates in the illustrated example with screw spindles 41, which operate in adjusting nuts 42 in the support traverses 25. The screw spindles 41, which are each provided with oppositely directed threads, sit on a common adjusting shaft 43, which runs under the roller system and can be adjusted at the end through a bevel gear by a common adjusting drive 44 such as a shaft extending parallel below the synchronization shaft 31. Other adjusting mechanisms are also possible, for example, chains, belts, hydraulics or electric servomotors.

Figure 4:
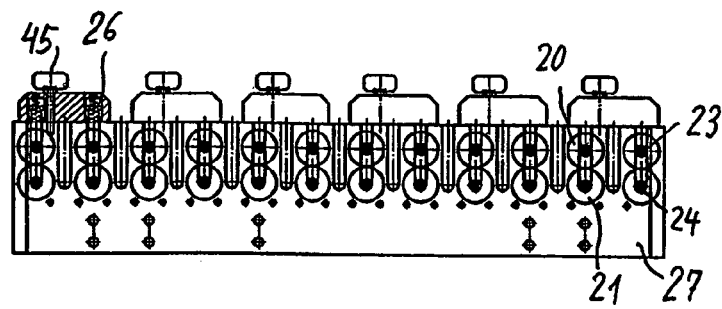
FIG. 4 is a view along the line IV-IV of FIG. 1.

FIG. 4 shows that the shafts 23, 24 are supported in the traverses 26, 27 in upwardly open slots so that they are pressed against one another and against the circuit board by a spring force or by their own weight. The pressure spring 26, also shown, can adjust this bearing pressure namely through an adjusting screw 45.

The device according to FIGS. 1 to 5 operates as follows:

In order to operate, the device is adjusted to the correct width for the circuit boards 12 to be treated by operating the adjusting drive 44, either manually or through a suitable servomotor, for example, an electric stepping motor (not illustrated). The adjusting shaft 43 is, for this purpose, rotated and the two traverses 25 move oppositely directed synchronously toward one another or away from one another through the adjusting spindles 41 and adjusting screws 42 provided with oppositely directed threads. This occurs between the two extreme positions, FIG. 2 (widest adjustment) and FIG. 3 (narrowest adjustment). The shafts are supported in the traverses 25, 27 by sleeves made out of a low friction material, the sleeves being fixedly mounted on the shafts, and prevent an axial shift relative to the traverse through lateral flanges or collars.

The shaft parts of the shafts 23, 24 move telescopically into one another, permitting adjustment of the width of the device. Shafts 23, 24 also enable the transfer of the driving rotation onto the rollers due to a guiding of the two shaft parts to one another, for example, like a key shaft or the like, which guiding is protected against torsion.

Figure 5:
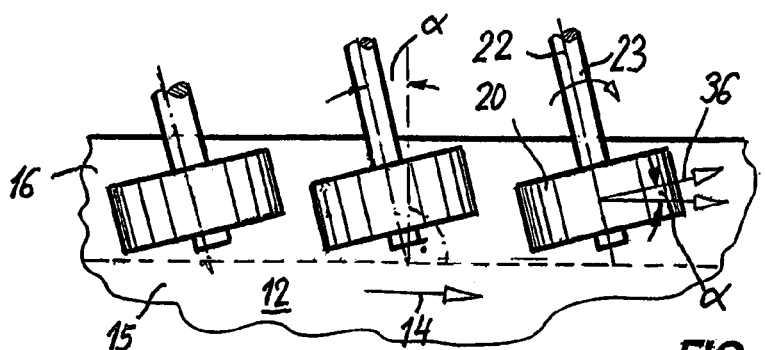
FIG. 5 is a schematic illustration of the angle position of the rollers.

The circuit boards 12 move in a transporting direction 14 into the transport module and are gripped in the boundary region 16 provided therefor by the roller tracks and are transported through the device. The rollers, which are relatively close to one another, provide for a constant horizontal guiding of a planar transport conveyor 46 formed by the circuit boards. A certain tensile force is applied to the circuit boards 12 by the angle position of the rollers and thus their rolling direction 36 relative to the transporting direction 14, which acts each oppositely directed on both sides of the circuit board, which tensile force tensions the circuit boards and thus transports the circuit board tensioned and essentially planar, however, but for the boundary regions, contact-free through the device. If the circuit boards have a nonusable region in their center area, a support can also be provided in this area. Since the rollers are aligned one behind the other with respect to their arrangement in the transporting direction 14, their contact area with the circuit boards 12 is limited to this relatively narrow boundary region 16, as can be seen from the sketch in FIG. 5 illustrated with a much exaggerated angle position.

The small transverse component of the roller movement on the circuit boards is due to the flexibility of the rollers being absorbed either by pressing the flexibility of the rollers being absorbed either by pressing the flexible rollers, or by creation of a small slipping movement in the transverse direction which does not hurt the circuit board since the boundary region 16 is anyway excluded from use.

By suitable partitions in the area of the traverses, in particular of the support traverse 25 closer to the rollers 20, 21, it is possible to adjust the actual treatment area, namely the area where the treatment device is filled with a liquid or the like, in each case to the width of the useful region 15 of the circuit board. This can, for example, be done with labyrinth-like packings.

The transport plane is, in the embodiment according to FIGS. 1 to 5, not only horizontal in its transporting direction but also in a transverse direction thereto. However, it is also possible with the device according to the invention to guide planar materials on inclined transport conveyors. Thus it would be possible in the case of a transport conveyor inclined in a transverse direction to counteract, for example, through a varying angle position of the pairs of rollers on both sides, a "moving inclination" of the circuit board in the direction of the side lying at the bottom. Such an inclined position could be chosen, for example, because of the better drainage of the liquid. It would in this case be possible to preferably adjust the angles of pitch of the rollers individually and independent from one another on both sides.

Figure 6:
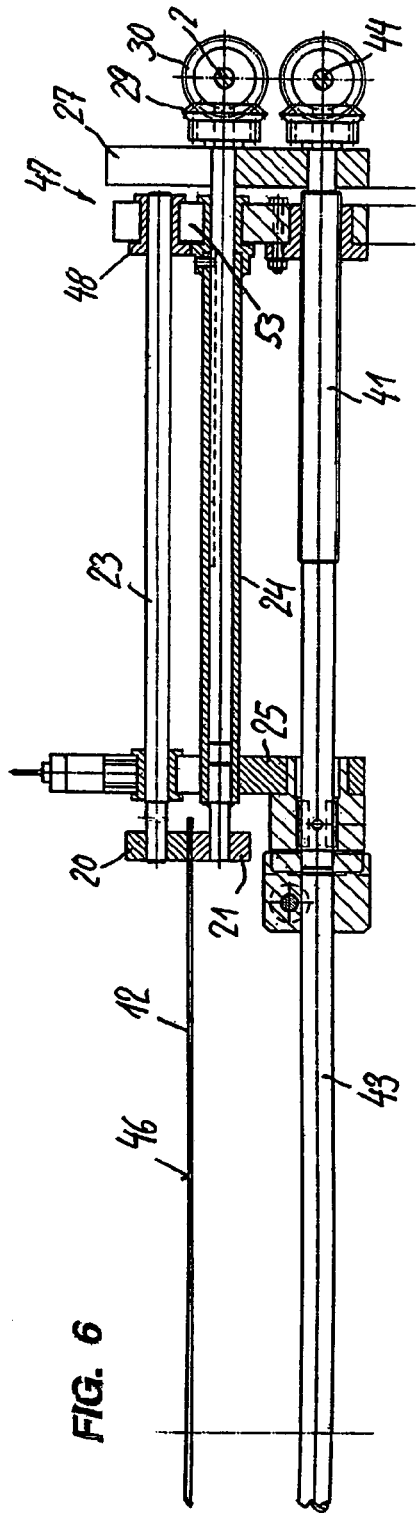
FIG. 6 is a detailed cross-sectional view corresponding to the right half of FIG. 2, however, with a different adjusting device.
Figure 7:
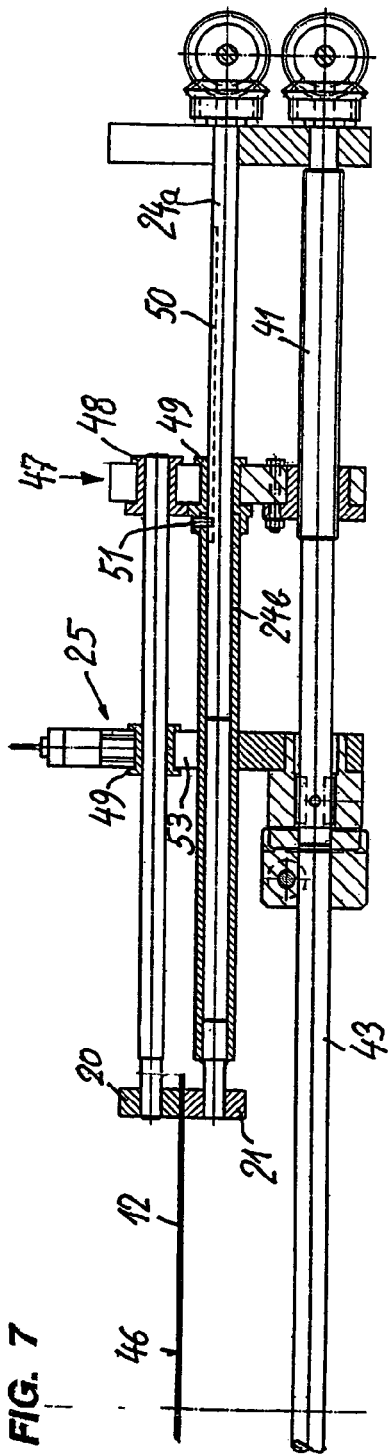
FIG. 7 shows the detail of FIG. 5 in a different adjustment of the transport width.

FIGS. 6 and 7 illustrate, also in two different width adjustments, a different design of the transporting means 19 and of the adjusting device 40. The traverse 25 near the rollers 20, 21 is fixed, that is, not movable with the adjusting device. Therefore a further adjusting traverse 47 is provided which supports the upper shaft 23 of the roller 20 at its end, namely by means of a bearing bush 48. The bearing bush 48 supports the shaft 23 nonmovably in an axial direction in the bearing slot 53 of the traverse 47, whereas the shaft 23 can move axially in a bearing sleeve 49 that mounts rotatably on the shaft 23 and is located in the traverse 25. The lower shaft 24 is, in contrast to the one-part shaft 23, designed in two parts, as shown in FIGS. 1 to 3, whereby the two parts 24a and 24b can be moved telescopically into one another. A groove 50 in the shaft part 24a cooperates with a guide pin 51 (see FIG. 7) in the tube-shaped shaft part 24b in order to prevent axial rotation. The shaft part 24a is guided by means of a bearing sleeve 49, which axially locks with and rotates with the shaft part 24b in the traverse 47. This shaft part is guided in the traverse 25 directly in a slot 53 similar to the illustration in FIG. 4.

The lower shaft 24 and accordingly the lower roller 21 is now in this embodiment directly driven, namely through the bevel gears 29, 30 by the synchronous shaft 31. The upper shaft 23 is directly rotatingly carried along through the circuit board 12 by the lower roller 21, which is sufficient in many cases. It is also possible to drive only some of the pairs of rollers, whereas the remaining pairs of rollers are driven directly by the circuit board. This has no significant influence on the expanding action tensioning the circuit board. Due to the relatively small forces to be applied, the fact that the entire transport means are usually moistened by liquid, and because the parts are manufactured out of a high-quality plastic or specially refined metals, which is necessary for reasons of chemical resistance, an easy run is guaranteed.

The adjusting device 40, as illustrated in FIGS. 6 and 7, also consists of an adjusting spindle 41 on an adjusting shaft 43, which is only rotatably supported in the traverse 25. The corresponding adjusting spindle 42 is mounted in the transversely movable traverse 47, which is movable for the width adjustment. It can thereby be recognized that the rollers 20, 21, together with their shafts, are moved through the traverse 25 toward the center and project accordingly farther or less far over the traverse 25.

Other adjusting devices and roller drives would be conceivable, for example through toothed belts, which grip from above into the treatment device and cooperate with a drive, which can be adjusted together with the rollers. It is possible to have the drive stationary on both sides of the treatment device via the illustrated adjusting device, namely both the adjusting drive and also the roller drive, so that one can arrange these parts outside of the actual treatment chamber, and thus protected against aggressive chemicals.

It became clear above that by influencing the running direction of the rollers relative to the transporting directions, namely on both sides oppositely directed, a tensile force can be applied onto the planar materials to be transported. This tensile force can be determined and adjusted by the angle position on the one hand, and by the pressing of the pairs of rollers on one another on the other hand. It is thus possible to guide the useful regions 15 of the planar materials through a device without contact, even though they themselves are flexible and so to speak "flabby". It is most of all possible to subject the materials during their treatment to forces which, for example, counter-act other forces placed upon the planar materials by the treatment process. For example, liquid applied via spray nozzles generates a force upon the planar materials, which, if not countered by an opposing force, could lead to the planar materials being deflected from the transport plane.

Figure 8:
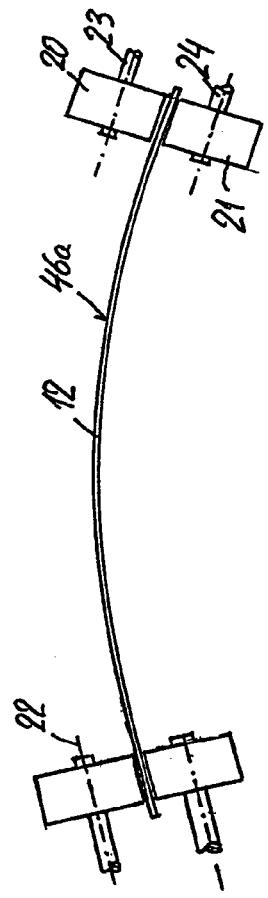
FIG. 8 is a schematic cross-sectional view of a device with an arched transport path.

In the case of slightly stiffer materials it would also be possible to bring about a stiffening by applying a certain pressure. Such a possibility is illustrated in FIG. 8. The planar material (circuit board) 12 is moved between two pairs of rollers 20, 21 on both sides of the treatment area into an upwardly directed arched form. The rollers are for this purpose arranged with upwardly directed inclined-positioned axes 22. A pitch angle of the rollers relative to the transporting direction, however, slightly inwardly directed (in contrast to FIGS. 1 to 7), which pitch angle is not illustrated in FIG. 8, assures that the circuit board 12 does not wander outwardly between the rollers due to the applied pressure.

Such an arched transport path 46a reinforces the planar material, and at the same time assures that during a treatment by spraying of a liquid, the liquid can adequately drain off without pooling on the surface, which would otherwise lead to non-uniform treatment results.

The invention claimed is:

1. A device for the transport of flexible plate-shaped or sheet-shaped planar material into treatment devices, comprising: transport means for gripping the planar material, transporting the planar material in a transporting direction onto a transport conveyor and applying a tension reinforcing the planar material and directed essentially transversely with respect to the transporting direction, the transport means housing roller tracks provided on opposite sides of the transport conveyor and pairs of rollers which have contact surfaces for rolling on boundary regions lying transversely opposite to one another and extending parallel with respect to the transporting direction and contacting the planar material from opposite planar sides under a contact pressure, and a space adjusting device for adjusting the distance between the roller tracks, wherein the rollers have axes which are arranged at an angle to the vertical relative to the transporting direction, the pairs of rollers follow one another in the transporting direction and run essentially in the boundary regions, at least partly driven pairs of rollers of each roller track cooperate under the contact pressure, shafts carrying the rollers are connected to the space adjusting device, the space adjusting device has a traverse guiding the shafts carrying the rollers and the space adjusting device is essentially movable transversely relative to the transporting direction.

2. The device according to claim 1, characterized in that the angle is from 0.1° to 2°.

3. The device according to claim 1, characterized in that for applying a tensile force onto the planar material the angle deviation is such that the rolling direction of the rollers relative to the transporting direction is directed outwardly.

4. The device according to claim 1, characterized in that for applying a compressive strain changing the planar material into an arched form, the transport means have contact surfaces, which grip the planar material at an angle relative to the plane of the planar material.

5. The device according to claim 1, characterized in that the roller tracks can each be synchronously oppositely adjusted.

6. The device according to claim 1, characterized in that at least driven shafts of the rollers are changeable in length and are driven per side by a common drive line.

7. The device according to claim 6, characterized in that the shafts are guided in two traverses, which can be moved toward one another, and of which one is movable and guides the shafts radially and axially, whereby either a traverse closest to the rollers is movable and during its movement its distance from the rollers remains essentially the same, or a movable traverse is farthest from the rollers and the shafts are longitudinally movable through the fixed traverse.

8. The device according to claim 1, characterized in that at least some of the pairs of rollers are driven.

9. The device according to claim 1, characterized in that the drive of each pair of rollers is driven by a drive line common for all pairs of rollers on one side.

10. The device according to claim 1, characterized in that the shafts of both rollers of a pair of rollers are oppositely directly synchronously driven.

11. The device according to claim 1, characterized in that only one roller of a pair of rollers is driven by its shaft, and the other roller is driven through frictional engagement through the planar material by the directly driven roller of the pair.

12. The device according to claim 1, characterized in that the adjusting device has several leading screws driven by a common adjusting shaft, the leading screws being connected to a movable traverses for their synchronous adjustment in the same direction.

13. The device according to claim 1, characterized in that the angle is adjustable for all rollers of a roller track and for both roller tracks together.

\* \* \* \* \*